US008938079B2

(12) United States Patent
Valeri et al.

(10) Patent No.: US 8,938,079 B2
(45) Date of Patent: Jan. 20, 2015

(54) ENGINE SOUND ENHANCEMENT IMPLEMENTATION THROUGH VARYING VEHICLE CONDITIONS

(75) Inventors: Frank C. Valeri, Novi, MI (US); Scott M. Reilly, Davisburg, MI (US); Larry G. Hartleip, Brighton, MI (US); William L. Hull, Okemos, MI (US); Stephane Richter, Florsheim (DE); John Randall Yost, Southfield, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 929 days.

(21) Appl. No.: 13/102,407

(22) Filed: May 6, 2011

(65) Prior Publication Data

US 2012/0109489 A1 May 3, 2012

Related U.S. Application Data

(60) Provisional application No. 61/408,380, filed on Oct. 29, 2010.

(51) Int. Cl.

| | |
|---|---|
| ***H04B 1/00*** | (2006.01) |
| ***H03G 3/00*** | (2006.01) |
| ***G10K 15/02*** | (2006.01) |

(52) U.S. Cl.

CPC ...................................... *G10K 15/02* (2013.01)
USPC ............................ 381/86; 381/61; 340/384.3

(58) Field of Classification Search

CPC ........ H03G 3/32; H04R 2449/13; H04R 5/02; H04B 1/082; B60Q 5/00; B60R 11/0217; G01K 15/02; G01K 2210/51
USPC .............. 381/61, 86, 302; 700/94; 340/384.3, 340/384.7; 701/53, 54, 102
See application file for complete search history.

(56) References Cited

U.S. PATENT DOCUMENTS

| | | | | |
|---|---|---|---|---|
| 5,237,617 A * | 8/1993 | Miller | ............................ | 381/61 |
| 5,635,903 A * | 6/1997 | Koike et al. | ................... | 340/441 |

(Continued)

FOREIGN PATENT DOCUMENTS

| | | |
|---|---|---|
| CN | 101366072 A | 2/2009 |

OTHER PUBLICATIONS

Chinese Office Action for application No. 201110462252.2, mailed Feb. 21, 2014, 6 pages.

*Primary Examiner* — Xu Mei
(74) *Attorney, Agent, or Firm* — Cantor Colburn LLP

(57) ABSTRACT

Engine sound enhancement (ESE) for a vehicle includes determining a current rate of change (ROC) in a position of an acceleration device of the vehicle from sensor data received from at least one sensor in communication with the acceleration device and calculating an ESE value based on the current ROC in the position of the acceleration device. The ESE value reflects an intensity and tone quality of at least one of the exhaust and the engine of the vehicle. The ESE also includes receiving a current RPM value, comparing the RPM value and the ROC in the position of the acceleration device to corresponding pre-defined threshold values, the pre-defined threshold values mapped to ESE tunings, and activating one of the ESE tunings when each of the current RPM value and the current ROC in the position of the acceleration device meets a corresponding pre-defined threshold value.

20 Claims, 7 Drawing Sheets

(56) References Cited

U.S. PATENT DOCUMENTS

| | | | | |
|---|---|---|---|---|
| 6,356,185 | B1 * | 3/2002 | Plugge et al. | 340/384.3 |
| 7,203,321 | B1 | 4/2007 | Freymann et al. | |
| 7,979,147 | B1 * | 7/2011 | Dunn | 700/94 |
| 8,320,581 | B2 * | 11/2012 | Hera et al. | 381/86 |
| 8,542,844 | B2 * | 9/2013 | Bowden et al. | 381/71.4 |
| 2006/0215846 | A1 | 9/2006 | Kobayashi et al. | |
| 2007/0160227 | A1 * | 7/2007 | Kogure et al. | 381/86 |
| 2011/0087403 | A1 * | 4/2011 | Fujikawa | 701/36 |

* cited by examiner

602

| | 0.001 | 0.002 | 0.003 | 0.004 | 0.005 | 0.006 | 0.007 | 0.008 | 0.009 | 0.010 |
|---|---|---|---|---|---|---|---|---|---|---|
| 10% | 100 | 50 | 33 | 25 | 20 | 17 | 14 | 13 | 11 | 10 |
| 20% | 200 | 100 | 67 | 50 | 40 | 33 | 29 | 25 | 22 | 20 |
| 30% | 300 | 150 | 100 | 75 | 60 | 50 | 43 | 38 | 33 | 30 |
| 40% | 400 | 200 | 133 | 100 | 80 | 67 | 57 | 50 | 44 | 40 |
| 50% | 500 | 250 | 167 | 125 | 100 | 83 | 71 | 63 | 56 | 50 |
| 60% | 600 | 300 | 200 | 150 | 120 | 100 | 86 | 75 | 67 | 60 |
| 70% | 700 | 350 | 233 | 175 | 140 | 117 | 100 | 88 | 78 | 70 |
| 80% | 800 | 400 | 267 | 200 | 160 | 133 | 114 | 100 | 89 | 80 |
| 90% | 900 | 450 | 300 | 225 | 180 | 150 | 129 | 113 | 100 | 90 |
| 100% | 1000 | 500 | 333 | 250 | 200 | 167 | 143 | 125 | 111 | 100 |

604

600

FIG. 6

ENGINE SOUND ENHANCEMENT IMPLEMENTATION THROUGH VARYING VEHICLE CONDITIONS

CROSS-REFERENCES TO RELATED APPLICATIONS

This patent application claims priority to U.S. Patent Application Ser. No. 61/408,380 filed Oct. 29, 2010 which is hereby incorporated herein by reference in its entirety.

FIELD OF THE INVENTION

The subject invention relates to engine sound enhancement for vehicles and, more particularly, to actuating and controlling engine sound enhancement through varying vehicle conditions.

BACKGROUND

Modern technology in the automotive field has yielded quieter engines and exhaust features on all types of vehicles. However, it is often the case where vehicle owners appreciate and value not only the visual design aspects of a vehicle, but also the particular engine and exhaust sounds and vibrations typically associated with vehicles, such as high-performance vehicles.

Accordingly, it is desirable to provide a sound enhancement system that introduces sounds that a vehicle occupant will appreciate.

SUMMARY OF THE INVENTION

In one exemplary embodiment of the invention, a method for implementing engine sound enhancement (ESE) for a vehicle is provided. The method includes determining, at a controller, a current rate of change in a position of an acceleration device of the vehicle from sensor data received from at least one sensor in communication with the acceleration device and calculating an ESE value based on the current rate of change in the position of the acceleration device. The ESE value reflects an intensity and tone quality of the exhaust and/or engine of the vehicle. The ESE also includes receiving a current RPM value, comparing the RPM value and the rate of change in the position of the acceleration device to corresponding pre-defined threshold values, the pre-defined threshold values mapped to ESE tunings, and activating one of the ESE tunings when each of the current RPM value and the current rate of change in the position of the acceleration device meet a corresponding pre-defined threshold value.

In another exemplary embodiment of the invention, a system for implementing engine sound enhancement for a vehicle is provided. The system includes a controller and engine sound enhancement (ESE) logic executable by the controller. The ESE logic implements a method. The method includes determining a current rate of change in a position of an acceleration device of the vehicle from sensor data received from at least one sensor in communication with the acceleration device and calculating an ESE value based on the current rate of change in the position of the acceleration device. The ESE value reflects an intensity and tone quality of the exhaust and/or engine of the vehicle. The ESE also includes receiving a current RPM value, comparing the RPM value and the rate of change in the position of the acceleration device to corresponding pre-defined threshold values, the pre-defined threshold values mapped to ESE tunings, and activating one of the ESE tunings when each of the current RPM value and the current rate of change in the position of the acceleration device meet a corresponding pre-defined threshold value.

In yet another exemplary embodiment of the invention a computer program product for implementing engine sound enhancement is provided. The computer program product includes a computer-readable storage medium having instructions embodied thereon, which when executed by a computer, cause the computer to implement a method. The method includes determining, at a controller, a current rate of change in a position of an acceleration device of the vehicle from sensor data received from at least one sensor in communication with the acceleration device and calculating an ESE value based on the current rate of change in the position of the acceleration device. The ESE value reflects an intensity and tone quality of the exhaust and/or engine of the vehicle. The ESE also includes receiving a current RPM value, comparing the RPM value and the rate of change in the position of the acceleration device to corresponding pre-defined threshold values, the pre-defined threshold values mapped to ESE tunings, and activating one of the ESE tunings when each of the current RPM value and the current rate of change in the position of the acceleration device meet a corresponding pre-defined threshold value.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which:

FIG. 6 is a chart illustrating sample data reflecting changes in an acceleration device position across multiple increments of time.

DESCRIPTION OF THE EMBODIMENTS

Figure 1:
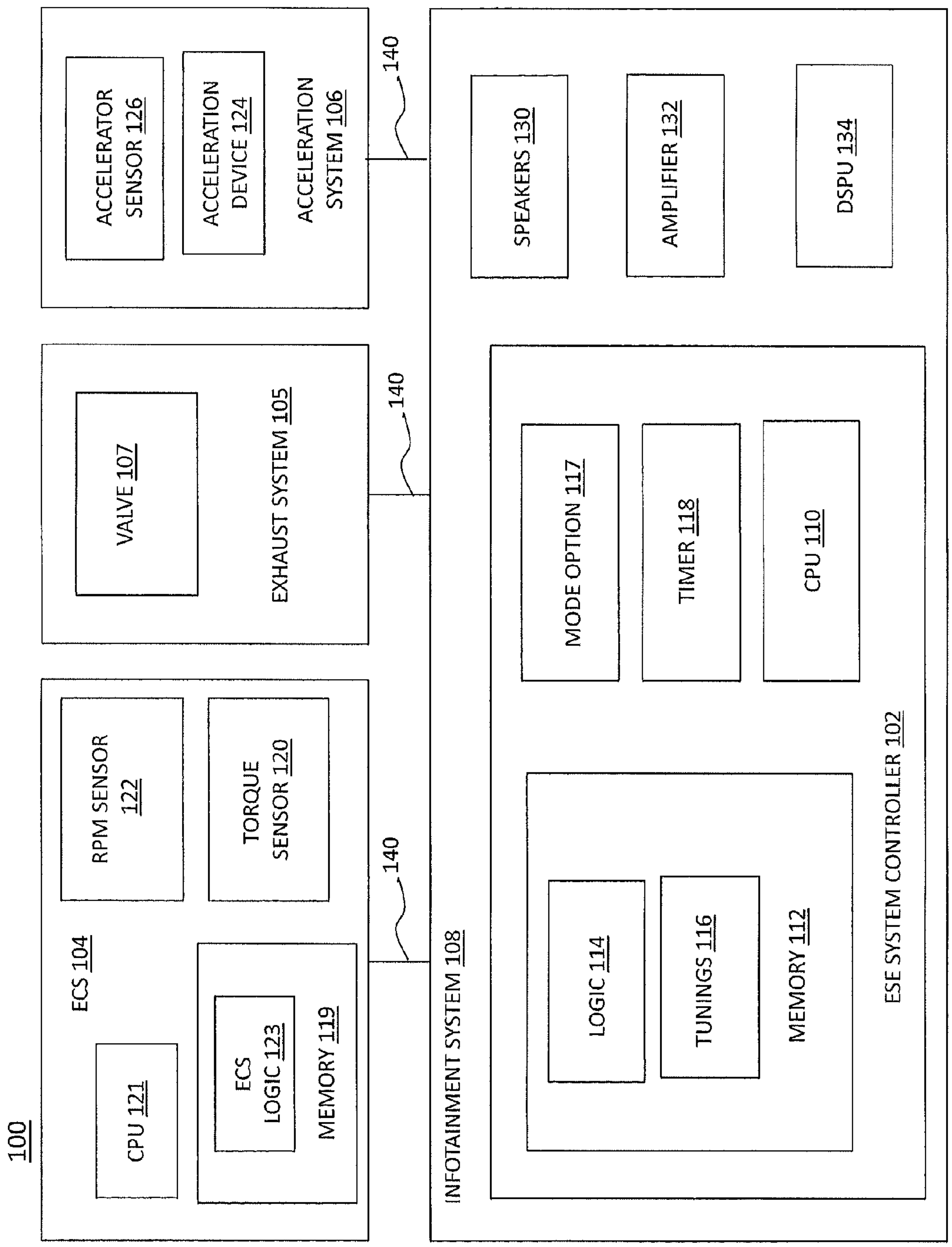
FIG. 1 is a system upon which engine sound enhancement may be implemented in accordance with an exemplary embodiment of the invention.

The following description is merely exemplary in nature and is not intended to limit the present disclosure, its application or uses. It should be understood that throughout the drawings, corresponding reference numerals indicate like or corresponding parts and features.

In accordance with an exemplary embodiment of the present invention, actuation and control of an engine sound enhancement (ESE) system for a vehicle is provided. The ESE system provides sounds associated with an automotive engine and/or exhaust that are commensurate with a driving experience, particularly during 'spirited' driving events, such as rapid acceleration, deceleration, double clutching, racing into a corner, etc. An ESE system may be defined as a vehicle technology that creates tones that are emitted in a way that blend with existing identifiable engine and/or exhaust sounds, such that the resultant sounds are pleasing to those in or around the vehicle. The exemplary ESE system processes derive sensor data from various components of a vehicle that measure varying driving operations or conditions, compare the data to thresholds set by the ESE system processes, and activate the ESE system (and de-active the ESE system) based upon the comparisons. The ESE system processes are configured to accommodate a vast number of varying driving events in the actuation and deactivation determinations. For example, examples of sensor data captured that reflect these various driving operations or conditions include double clutching into a curve, racing into a curve, pulling ahead of another vehicle when lanes converge, moderate acceleration or deceleration involving a downshift, merging quickly onto a highway, etc. These conditions cause the ESE system processes to activate the ESE system. The sensor data reflects the driving operations or conditions (e.g., when racing into a curve, sensor data reflects wide open throttle, high torque demand from the engine, and then various pedal stabs, and increasing RPM.) Likewise, the ESE system processes may monitor conditions and de-activate the ESE system when other conditions are determined (e.g., climbing a mountain, driving at a steady state, moderate acceleration away from a light, and 'sawing' at the throttle while driving at a steady speed, to name a few.

Turning now to FIG. 1, a system 100 upon which ESE system processes may be implemented will now be described in an exemplary embodiment. The system 100 includes an infotainment system 108 in communication with an engine control system 104, an exhaust system 105, and an acceleration system 106. The communication may be implemented using wireless and/or wireline means including a vehicle's high speed bus 140. In an exemplary embodiment, the infotainment system 108, the engine control system 104, and the acceleration system 106 all form part of an automotive vehicle (not shown).

In an exemplary embodiment, the engine control system 104 facilitates operations of various components of the vehicle of system 100 (e.g., as a command center or central processing center). The engine control system 104 includes a computer processing unit (CPU) 121 and memory 119. A computer processing unit (CPU) 110 of the infotainment system 108 communicates with the memory 119 to implement engine control system (ECS) logic 123 residing therein. The CPU 121 includes hardware elements (e.g., circuitry, logic cores, registers, etc.) for processing data configured to facilitate operation of the various components of the vehicle, such as those often associated with a vehicle's engine control module. The CPU 121 communicates with the infotainment system 108 to provide sensor data received from the various components of the vehicle, as described further herein. It will be understood that the engine control system 104 may be implemented in hardware, software, or a combination thereof.

In an exemplary embodiment, the infotainment system 108 includes an ESE system controller 102 in communication with one or more speaker(s) 130, an amplifier 132, and a digital signal processing unit 134. The speaker(s) 130 and amplifier 132 may be part of a vehicle's audio system. The digital signal processing unit 134 receives commands from the ESE system logic 114 based upon the sensor data and calculations performed thereon to derive and generate a particular tuning 116, which is then output through the amplifier 132 and, ultimately, the speaker(s) 130.

The ESE system controller 102 includes the CPU 110, memory 112, a timer 118, and a driver-selectable mode option 117. The CPU 110 communicates with the memory 112 to implement ESE system logic 114 and ESE system tunings 116. The CPU 110 includes hardware elements (e.g., circuitry, logic cores, registers, etc.) for processing data configured to implement the exemplary ESE system processes described herein. It will be understood that the ESE system controller 102 may be implemented in hardware, software, or a combination thereof. In an exemplary embodiment, the ESE system controller 102 executes the ESE system logic 114 for implementing the exemplary ESE system processes described further herein. The ESE system logic 114 stores various threshold values used to determine when to activate and de-activate the ESE system as described herein. These various threshold values are pre-defined and may be tunable parameters that are adjustable by a programmer or administrator of the ESE system logic 114. The ESE system logic 114 and the ESE system tunings 116 may reside in the memory 112 of the ESE system controller 102.

The ESE system tunings 116 simulate a number of sounds representative of the engine and/or exhaust of the vehicle when the vehicle is experiencing a driving event that is defined by the pre-defined threshold values. For example, if the driving event is rapid acceleration, an ESE system tuning may be determined or selected from a group of ESE system tunings 116 that simulates what is often referred to as a 'growl' that is expected by a driver of the vehicle to reflect this rapid acceleration. Varying intensities and tones of sounds attributable to a wide range of driving events may be simulated and implemented as the ESE system tunings 116.

The timer 118 may be a clock timer that measures time in seconds and fractions thereof. The timer 118 is activated to monitor elapsed time between various conditions and provides this information to the ESE system logic 114 for calculating various events as described further herein.

The driver-selectable mode option 117 may be configured as a physical element disposed on the vehicle dashboard or may be integrated with the infotainment system 108 features illustrated in FIG. 1. The driver-selectable mode option 117 is selected or activated by a vehicle occupant when the occupant desires to engage in a 'spirited driving' event. For purposes of illustration, this spirited driving event is referred to herein as 'race mode.' The driver-selectable mode option 117 is described further herein.

The engine control system 104 includes sensors that monitor various conditions such as air flow through the engine, fuel flow into the engine, spark timing, cam phasor position and current revolutions-per-minute (RPM), to name a few. As shown in FIG. 1, the engine control system 104 includes a torque sensor 120 and an RPM sensor 122. From these monitored values, the vehicle engine's anticipated torque output can be calculated (e.g., from the torque sensor 120). Also, the vehicle's RPM can be continuously monitored via the RPM sensor 122 and a rate of change of the RPM can be calculated. The RPM and rate of change of RPM values may be determined via the sensor 122, the ESE system logic 114, and the timer 118, and used in determining when to activate and/or de-activate an ESE system tuning, as well as determining which of the ESE system tunings 116 to activate.

The exhaust system 105 includes a valve 107 that controls the opening and closing of an exhaust component (e.g., muffler) of the vehicle. The valve 107 may be activated by an occupant of the vehicle system 100 when the occupant wishes to engage in a 'spirited driving' event, or race mode. The occupant selects the driver-selectable mode option 117, which may reside on the vehicle system's 100 dashboard, and the CPU 110 transmits a signal over the bus 140 to the exhaust system 105, which causes the valve 107 to open, thereby enhancing the existing sound emitted from the vehicle system's 100 exhaust component. In an exemplary embodiment, the ESE system logic 114 is configured to assess data regarding the driver's activities (speed, acceleration, and related sensor data) in conjunction with the current state of the driver-selectable mode option 117 before determining whether to activate the engine sound enhancement features described herein. The driver-selectable mode option 117 is described further in FIG. 7.

Figure 3:
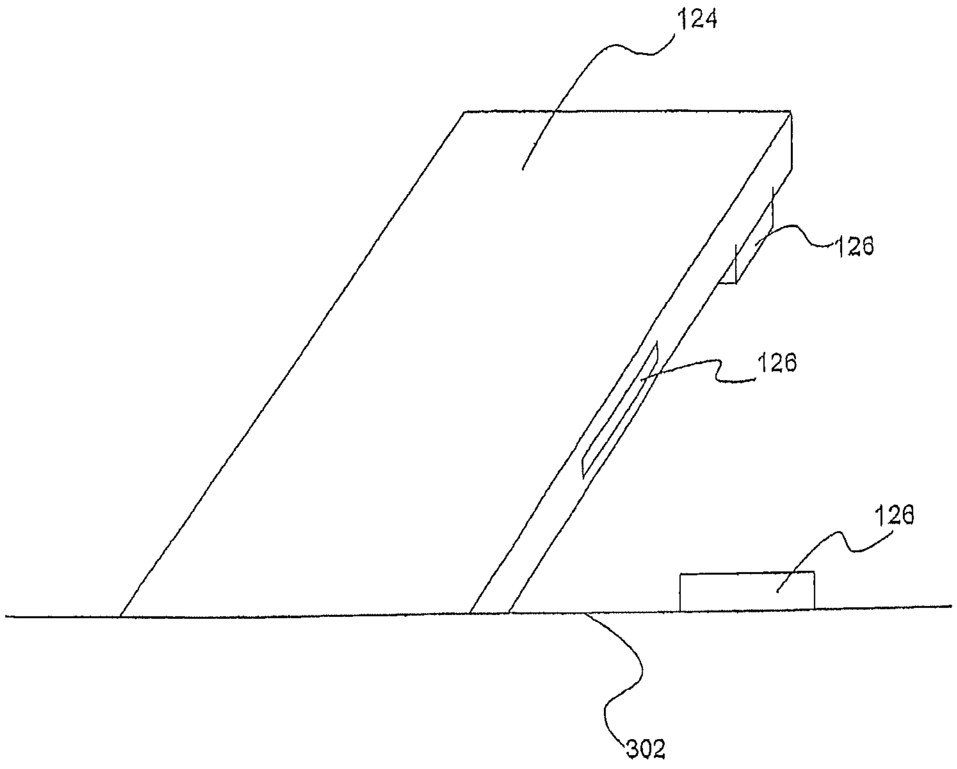
FIG. 3 is a diagram of a detailed portion of the system of FIG. 1 in accordance with an exemplary embodiment.

The acceleration system 106 includes an acceleration device 124 and an accelerator sensor 126 (FIG. 3). The acceleration device 124 may be a floor pedal, a lever, or other driver-operated control that provides driver-intended acceleration information to the ESE system controller 102 that is interpreted by the ESE system logic 114 for use in controlling the acceleration and deceleration of the vehicle. The sensor 126 calculates a relative position of the acceleration device 124 and, in conjunction with the ESE system logic 114, is used to calculate a rate of change in the position of the acceleration device 124 in order to determine when to activate and/or de-active an ESE system tuning, as well as determine which of the ESE system tunings 116 to activate.

The infotainment system 108 may include components, such as a deck, tuner, and other audio system devices, as well as the speaker(s) 130, amplifier 132, and digital signal processing unit 134 described above. Components of the infotainment system 108 may be disposed, at least in part, in or near the cabin of the vehicle of the system 100 or in any location that facilitates execution of the ESE system tunings 116, such that they introduce vehicle sounds that the vehicle occupant will appreciate based upon the driving events occurring with respect to the vehicle.

Figure 2:
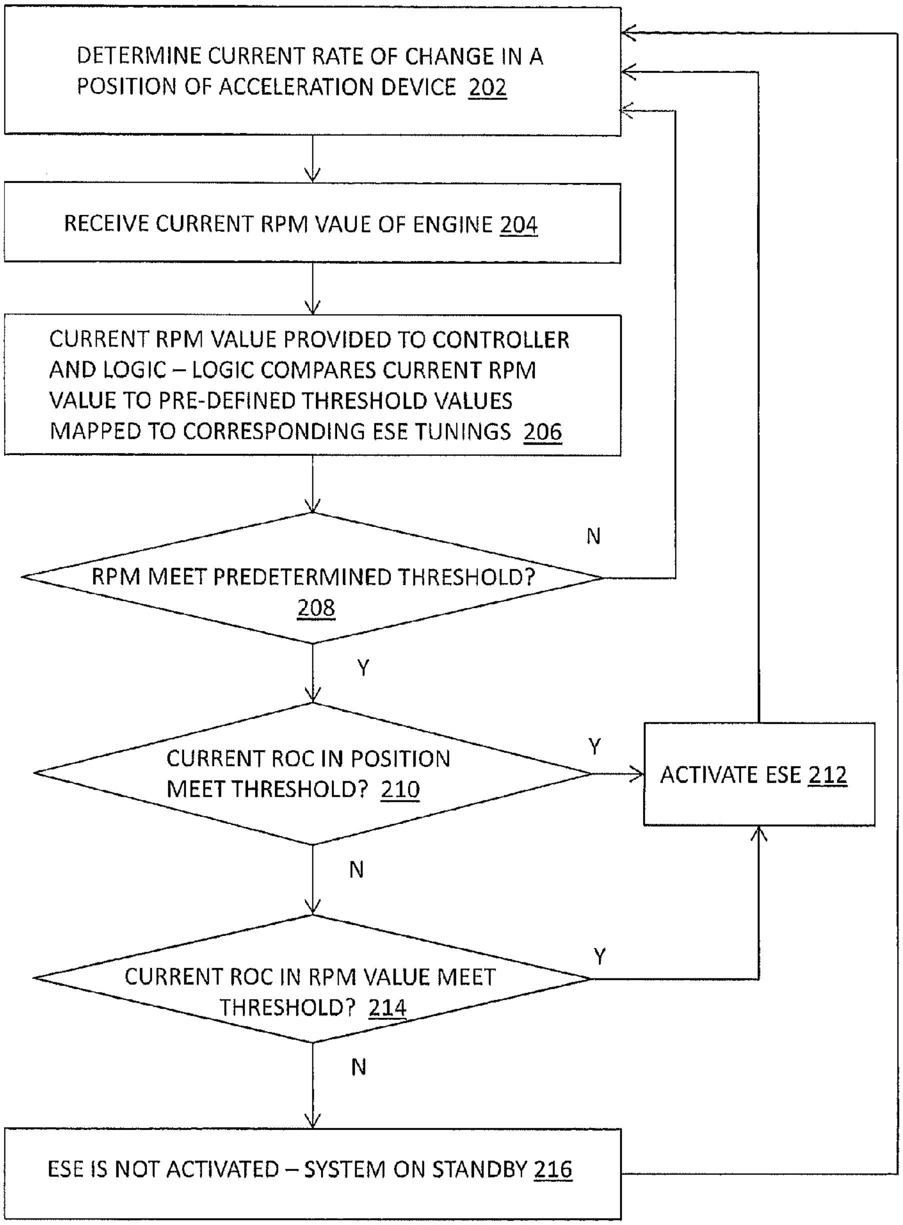
FIG. 2 is a flow diagram describing a process for rendering an actuation determination of engine sound enhancement in accordance with an exemplary embodiment.
Figure 4:
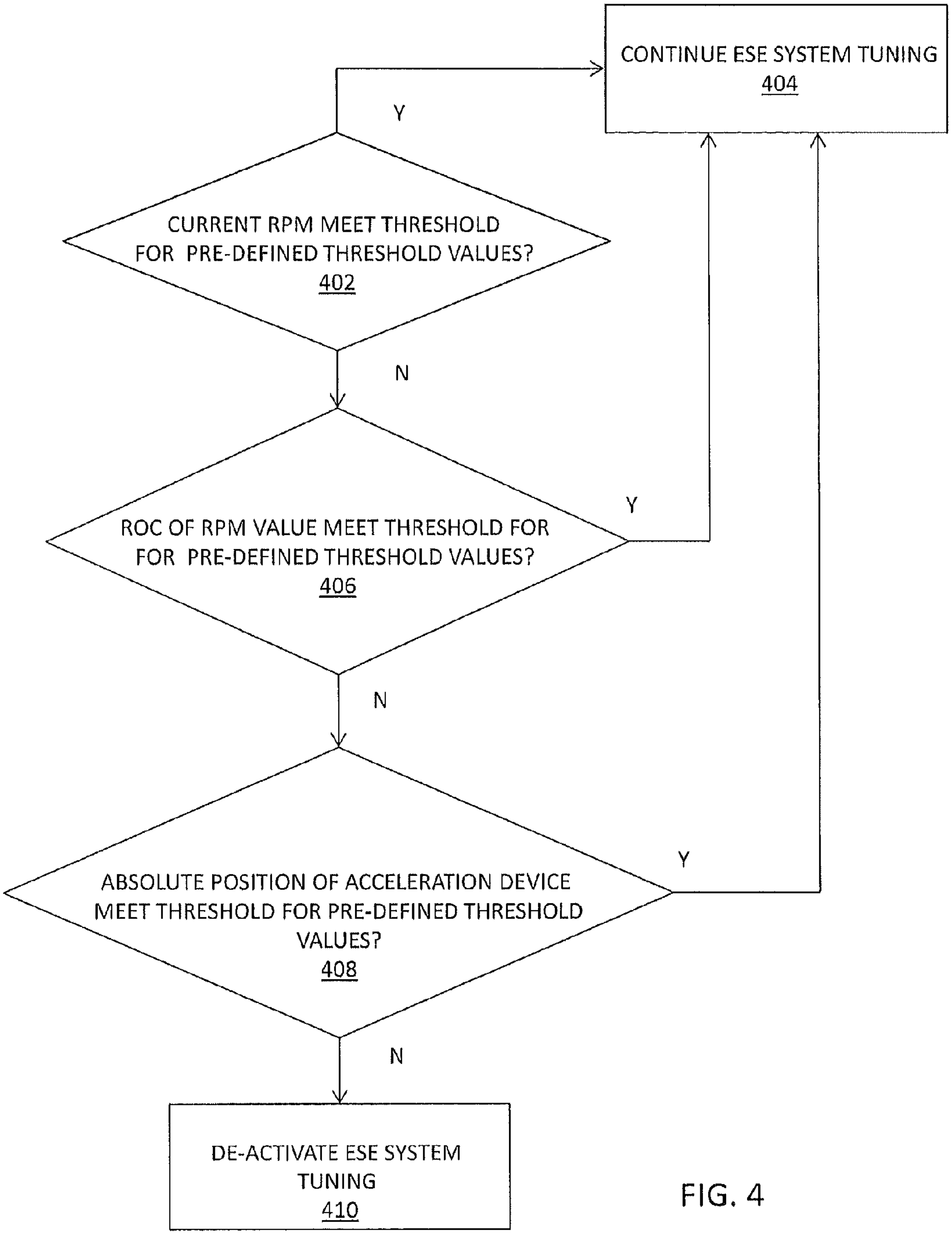
FIG. 4 is a flow diagram describing a process for rendering a de-activation determination of engine sound enhancement in an exemplary embodiment.
Figure 5:
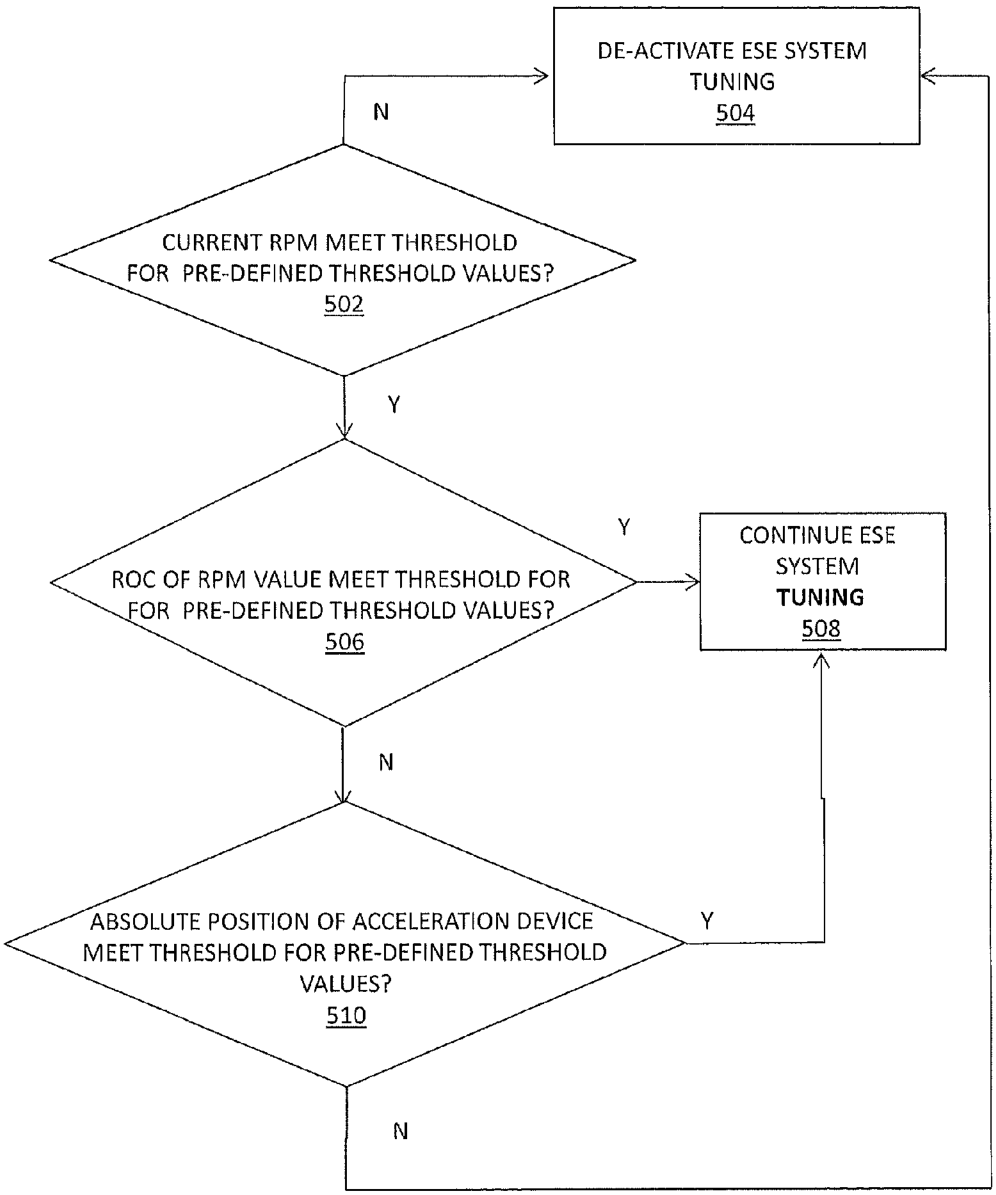
FIG. 5 is a flow diagram describing a process for rendering a de-activation determination of engine sound enhancement in an alternative exemplary embodiment.

FIGS. 2, 4, and 5 describe processes for implementing the exemplary engine sound enhancement. Turning now to FIG. 2, a process for rendering an actuation determination of the engine sound enhancement will now be described in an exemplary embodiment. The process described in FIG. 2 assumes that an individual is engaged in driving the vehicle of the system 100; i.e., the engine is on and a subject is in the driver compartment of the vehicle.

At step 202, the ESE system logic 114 determines a current rate of change in a position of the acceleration device 124 of the vehicle from sensor data received from the sensor 126, which is in communication with the acceleration device 124. The sensor 126, as well as the calculation of the rate of change in its position, is described further in FIG. 3. The rate of change in this position is monitored for a tunable length of time (e.g., via the timer 118). This rate of change in position is manipulated and used by the ESE system logic 114 to make a decision on the potential tone (e.g., aggression) of the sound enhancement. The ESE system controller 102 is continuously evaluating conditions and preparing to execute the ESE system tunings if a previous decision is made by ESE system controller 102 to turn the ESE system on. The ESE system logic 114 assigns an ESE level to the rate of change in the position of the acceleration device 124 that reflects both a corresponding intensity and tone of the driving event that precipitated the rate of change in position value.

At step 204, the ESE system controller 102 receives a current revolutions-per-minute (RPM) value of the engine. The current RPM value is detected by the sensor 122 and provided to the controller 102 and the ESE system logic 114 at step 206. The ESE system logic 114 compares the current RPM value to corresponding pre-defined threshold values that have been set via the ESE system logic 114 at step 206. The pre-defined threshold values are mapped to corresponding ESE system tunings. If the RPM does not meet a predetermined threshold value at step 208, the ESE system is left on standby mode (i.e., the ESE system is not activated) and the process returns to step 202, whereby the controller 102 continues to monitor the rate of change in position of the acceleration device 124 (step 202) and the RPM value (step 204). If, however, the RPM value meets the predetermined threshold value at step 208, the process continues to step 210.

If the current RPM value meets a threshold value corresponding to one of the pre-defined threshold values at step 208, the ESE system logic 114 then determines whether the current rate of change in the position of the acceleration device 124 meets a threshold value corresponding to one of the pre-defined threshold values at step 210. If so, the ESE system is activated at step 212, which means that an ESE system tuning 116 is selected based upon the value (e.g., current rate of change in position) considered at step 202, and is implemented through the infotainment system 108.

If, however, the rate of change in the position of the acceleration device 124 does not meet the threshold value at step 210, the ESE system logic 114 then determines whether the current rate of change of the RPM meets a threshold value corresponding to one of the pre-defined threshold values at step 214. If so, the ESE system is activated at step 212 as described above. If not, the ESE system is not activated at step 216, the system remains on standby, and the process returns to step 202.

The exemplary ESE system processes may include evaluating other criteria in rendering its ESE system activation decisions in addition to, or in lieu of, the criteria described in FIG. 2. For example, in one alternative embodiment, in lieu of assessing the current rate of change in RPM (step 214), the ESE system logic 114 may be configured to assess one or more of accelerator input from the vehicle, calculated torque, accelerator device position, percentage of stroke of the accelerator device position, and electric motor current.

In one such embodiment, the current absolute position of the acceleration device 124 (e.g., from being fully engaged to totally unengaged) is described. In this embodiment, if the rate of change in the position of the acceleration device 124 does not meet the threshold value at step 210, the ESE system logic 114 then determines whether the current absolute position of the acceleration device 124 meets a threshold value corresponding to one of the pre-defined threshold values. If so, the ESE system is activated as described in step 214 as described above. If not, the ESE system is not activated as described in step 216, and the system remains on standby monitoring as described in step 202.

In another alternative embodiment, in lieu of assessing the current rate of change in RPM (step 214), the ESE system logic 114 may be configured to assess the current absolute percentage of total stroke (i.e., the percentage of movement of the acceleration device 124). In this embodiment, if the rate of change in the position of the acceleration device 124 does not meet the threshold value at step 210, the ESE system logic 114 then determines whether the current absolute percent of total stroke meets a threshold value corresponding to one of the pre-defined threshold values. If so, the ESE system is activated as described in step 212 above. If not, the ESE system is not activated as described in step 216 above, and the process continues to monitor these values as described in steps 202 and 204.

In another alternative embodiment, in lieu of assessing the current rate of change in RPM (step 214), the ESE system logic 114 may be configured to assess the torque value from torque sensor 120). In this embodiment, if the rate of change in the position of the acceleration device 124 does not meet the threshold value as described in step 210, the ESE system logic 114 then determines whether the torque calculated by the engine control system 104 (and measured via the torque sensor 120) meets a threshold value corresponding to one of the pre-defined threshold values. If so, the ESE system is activated as described in step 212 above. If not, the ESE system is not activated as described in step 216 above, and the system remains on standby monitoring (the process returns to step 202). The value from the torque sensor 120 may be useful in assessing operating conditions, such as when the driver double clutches to downshift. The driver or control module flares the engine to match output to input shaft speeds. In such an instance, the acceleration device 124 is pushed down quickly and through a sizeable range, ending at a low absolute level before the vehicle engine can react. In this scenario, while the RPM value may meet the threshold value, the torque value may be low. The ESE system logic 114 may be configured to activate the ESE system under these conditions to reflect the driver expectation of sound commensurate with the double clutch operation by setting the threshold torque value at a low level.

As indicated above, the ESE system logic 114 determines a current position of the acceleration device 124, as well as a rate of change in the position of the acceleration device 124. Turning now to FIG. 3, an exemplary embodiment of the acceleration system 106 used in calculating these values will now be described. One or more sensors 126 are disposed on or near the acceleration device 124. As shown in FIG. 3, sensors 126 may be placed on the acceleration device 124 (e.g., underneath), embedded in the acceleration device 124, or on a floor 302 of the vehicle near the acceleration device 124. One or both of the sensors 126 determine a relative position of the acceleration device 124. The relative position may be determined as an angle of the acceleration device 124, which changes based upon the engagement level of the acceleration device 124. For example, a non-engaged acceleration device 124 may have an angle of 40 degrees with respect to the floor 302 of the vehicle, while a fully engaged acceleration device 124 may have an angle of 0 degrees with respect to the floor 302 of the vehicle. The position or angle of the acceleration device 124 may be calculated using various techniques. For example, with two sensors 126 placed at specific locations on or near the acceleration device 124, triangulation analysis using sensor data from the two sensors with respect to a fixed point may be employed to determine the position of the acceleration device 124.

The rate of change in the position of the acceleration device 124 may be determined by the ESE system logic 114 using data from the timer 118 and the sensors 126. For example, the ESE system logic 114, through the sensor data, identifies a first position of the acceleration device 124. The first position is identified at a starting time increment that is provided by the timer 118. The ESE system logic 114 also identifies a second position of the acceleration device 124. The second position is identified at an ending time increment that is provided by the timer 118. The ESE system logic 114 tracks the amount of time elapsed between the starting time increment and the ending time increment.

The ESE system logic 114 calculates a deviation value reflecting a difference between the first position and the second position (e.g., a difference between the angles of the first and second positions with respect to a plane, such as the floor 302). The ESE system logic 114 divides the deviation value from the amount of time elapsed between the starting time increment and the ending time increment. The resulting value reflects the rate of change in the position of the acceleration device 124.

It will be understood by those skilled in the art that other methods of determining a position of the acceleration device 124 and rate of change thereof may be used in implementing the exemplary ESE system processes. For example, a sensor may be used to measure a linear distance of the acceleration device 124 from a plane, such as the floor 302. The ESE system logic 114 may be configured with the linear distance between the acceleration device 124 and the plane 302 and the sensor provides data that specifies an actual or current distance of the acceleration device 124 from the plane 302. In this embodiment, the sensor may be placed at a location of the acceleration device that is furthest away from the plane 302 when the acceleration device 124 is not engaged. The rate of change in the position may be calculated from the differences of two linear measurements of the positional data of the acceleration device 124.

In one embodiment, the ESE system logic 114 may utilize percentages of change in acceleration device 124 position over specific time increments to determine when to activate and de-activate the ESE system processes described herein. A chart 600 with sample data that may be used in this calculation is shown in FIG. 6.

Once the ESE system is activated, and an ESE system tuning 116 is implemented, the ESE system logic 114 continues to monitor vehicle conditions to determine when to de-active the ESE system. Turning now to FIG. 4, a process used to determine when to de-activate the ESE system tuning will now be described in an exemplary embodiment. The process described in FIG. 4 is used when the RPM threshold value is set higher than a turn-on threshold value of the ESE system. In an example scenario, if a driver of the vehicle is climbing a hill and decides to pass another vehicle, the ESE system is activated. The driver pulls back into his original lane and continues to accelerate at a moderate level. The RPM is elevated and climbing, but slowly. At wide open throttle (WOT), it may be desirable for the engine to sound the same as it did while passing the vehicle even though the RPM rate of increase is lower. The exemplary ESE system processes may continue to activate the ESE system in this scenario, which is described in FIG. 4. The process of FIG. 4 assumes that the sensor data is continually received by the sensors 120, 122, and 126 and the processes described in steps 202-206 of FIG. 2 have been performed.

At step 402, the ESE system logic 114 determines if the current RPM value meets a threshold value corresponding to one of the pre-defined threshold values. If so, the ESE system tuning 116 is continued at step 404. If the current RPM value does not meet the threshold value of step 402, the ESE system logic 114 determines if the rate of change of the RPM value meets a threshold value corresponding to one of the pre-defined threshold values at step 406. If so, the ESE system tuning is continued as described in step 404. Otherwise, the ESE system logic 114 then determines if the absolute position of the acceleration device 124 meets a threshold value corresponding to one of the pre-defined threshold values at step 408. If so, the ESE system tuning is continued as described in step 404. Otherwise, the ESE system tuning is de-activated at step 410.

Turning now to FIG. 5, a process used to determine when to de-activate the ESE system tuning will now be described in an alternative exemplary embodiment. The process described in FIG. 5 is used when the RPM threshold value is the same as a turn-on threshold value of the ESE system. The process of FIG. 5 assumes that the sensor data is continually received by the sensors 122 and 126, and the process described in steps 202-206 have been performed.

At step 502, the ESE system logic 114 determines if the current RPM value meets a threshold value corresponding to one of the pre-defined threshold values. If not, the ESE system tuning is de-activated at step 504. Otherwise, if the current RPM value meets the threshold value of step 502, then the ESE system logic 114 determines if the rate of change of the RPM meets a threshold value corresponding to one of the pre-defined threshold values at step 506. A sample scenario of this event is when a driver is climbing a hill but is not accelerating briskly anymore. The exemplary ESE system processes will de-activate the ESE in this scenario. If the rate of change in the RPM value meets the threshold value at step 506, the ESE system tuning is continued in step 508. Otherwise, the ESE system logic 114 then determines if the absolute position of the acceleration device 124 meets a threshold value corresponding to one of the pre-defined threshold values at step 510. If so, the ESE system tuning is continued as described in step 508. Otherwise, the ESE system tuning is de-activated as described in step 504.

As indicated above, the ESE system features may be implemented in combination with the driver-selectable mode option 117. In an exemplary embodiment, once the driver of the vehicle selects this option 119, the ESE system logic 114 performs the functions recited in FIG. 2, with modifications as will now be described in FIG. 7.

Figure 7:
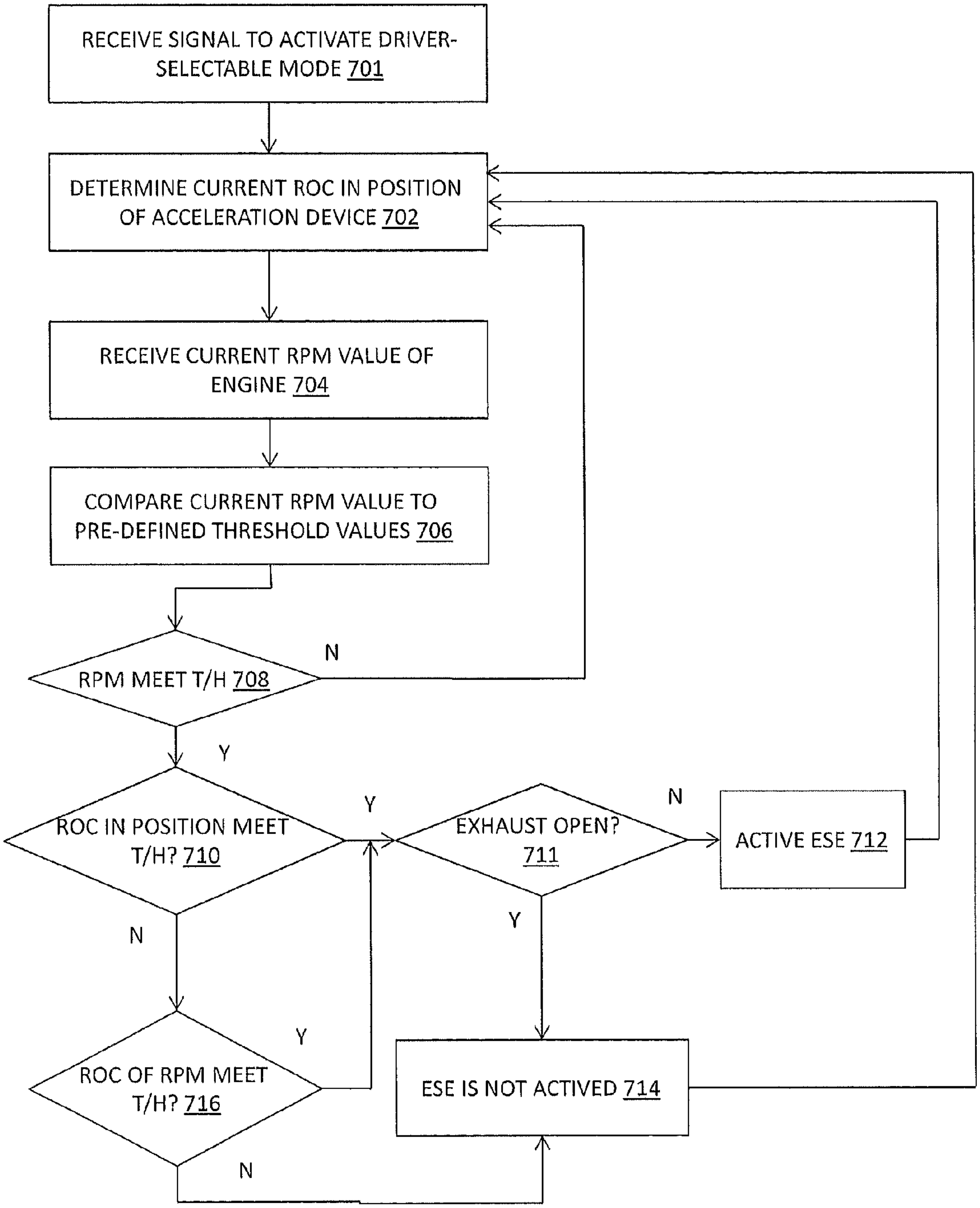
FIG. 7 is a flow diagram describing a process for rendering an actuation determination of engine sound enhancement in accordance with an alternative exemplary embodiment.

The process described in FIG. 7 assumes that an individual is engaged in driving the vehicle of the system 100; i.e., the engine is on and a subject is in the driver compartment of the vehicle.

At step 701, the ESE system logic 114 receives a signal to activate the driver-selectable mode option 117 to engage in a spirited driving or 'race mode' experience. In other words, the driver has selected this option 119 and a signal is transmitted to the ESE system logic 114 accordingly. At step 702, the ESE system logic 114 determines a current rate of change in a position of the acceleration device 124 of the vehicle from sensor data received from the sensor(s) 126, which are in communication with the acceleration device 124. The rate of change in this position is monitored for a tunable length of time (e.g., via the timer 118). This rate of change in position is manipulated and used by the ESE system logic 114 to make a decision on the potential tone or aggression of the sound enhancement. The ESE system controller 102 is continuously evaluating conditions and preparing to execute the ESE system tunings if a previous decision is made by ESE system controller 102 to turn the ESE system on. The ESE system logic 114 assigns an ESE level to the rate of change in the position that reflects both a corresponding intensity and tone of the driving event that precipitated the rate of change in position value.

At step 704, the ESE system controller 102 receives a current revolutions-per-minute (RPM) value of the engine. The current RPM value is detected by the sensor 122 and provided to the controller 102 and the ESE system logic 114 at step 706. The ESE system logic 114 compares the current RPM value to corresponding pre-defined threshold values that have been set via the ESE system logic 114 at step 706. The pre-defined threshold values are mapped to corresponding ESE system tunings. If the RPM does not meet a predetermined threshold value at step 708, the ESE system is left on standby mode (i.e., the ESE system is not activated) and the process returns to step 702, whereby the controller 102 continues to monitor the rate of change in position of the acceleration device 124 (step 702) and the RPM value (step 704). If, however, the RPM value meets the predetermined threshold value at step 708, the process continues to step 710.

If the current RPM value meets a threshold value corresponding to one of the pre-defined threshold values at step 708, the ESE system logic 114 then determines whether the current rate of change in the position of the acceleration device 124 meets a threshold value corresponding to one of the pre-defined threshold values at step 710. If so, it is then determined whether the exhaust valve 119 is open (i.e., the driver-selectable mode option 117 has been selected) at step 711. If not, the ESE system is activated at step 712, which means that an ESE system tuning 116 is selected based upon the value (e.g., current rate of change in position) considered at step 702, and is implemented through the infotainment system 108. The process then returns to step 702. If, however, the exhaust valve is open at step 711, this means that the driver is experiencing enhanced sound through the components of the exhaust system 105. Thus, no additional or enhanced ESE system tunings are needed. At step 714, the ESE system is not activated, and the process returns to step 702.

Returning to step 710, if the rate of change in the position of the acceleration device 124 does not meet the threshold value at step 710, the ESE system logic 114 then determines whether the current rate of change of the RPM meets a threshold value corresponding to one of the pre-defined threshold values at step 716. If so, it is then determined whether the exhaust valve 119 is open (i.e., the driver-selectable mode option 117 has been selected) at step 711. If not, the ESE system is activated at step 712, which means that an ESE system tuning 116 is selected based upon the value (e.g., current rate of change in position) considered at step 702, and is implemented through the infotainment system 108. The process then returns to step 702. If, however, the exhaust valve is open at step 711, this means that the driver is experiencing enhanced sound through the components of the exhaust system 105. Thus, no additional or enhanced ESE system tunings are needed, and the system remains on standby. At step 714, the ESE system is not activated, and the process returns to step 702.

De-activating the ESE system features using the driver-selectable mode option 117 may be implemented in a similar manner as that described in FIGS. 4 and 5 above with some minor modifications. For example, the processes in FIGS. 4 and 5 may include initial steps of receiving a signal to activate the driver-selectable mode option 117 and valve position determination before processing the steps recited therein. If it is determined that the valve is opened in this initial step, the ESE system processes de-activate the ESE system tunings. Otherwise, if the valve position is closed, the remaining steps of FIGS. 4 and 5 would be performed as illustrated therein.

As described above, the invention may be embodied in the form of computer implemented processes and apparatuses for practicing those processes. Embodiments of the invention may also be embodied in the form of computer program code containing instructions embodied in tangible media, such as floppy diskettes, CD-ROMs, hard drives, or any other computer readable storage medium, wherein, when the computer program code is loaded into and executed by a computer, the computer becomes an apparatus for practicing the invention. An embodiment of the invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the present application.

What is claimed is:

1. A method for implementing engine sound enhancement (ESE) for a vehicle, the method comprising:

determining, via a controller, a current rate of change in a position of an acceleration device of the vehicle from sensor data received from at least one sensor in communication with the acceleration device;

calculating an ESE value based on the current rate of change in the position of the acceleration device, the ESE value reflecting an intensity and tone quality of at least one of an exhaust and an engine of the vehicle;

receiving a current revolutions-per-minute (RPM) value of the engine;

comparing the current RPM value and the current rate of change in the position of the acceleration device to corresponding pre-defined threshold values, the pre-defined threshold values mapped to engine sound enhancement (ESE) tunings; and activating one of the ESE tunings when each of the current RPM value and the current rate of change in the position of the acceleration device meet a corresponding one of the pre-defined threshold values.

2. The method of claim 1, wherein the activated ESE tuning simulates a sound representative of at least one of the exhaust and the engine of the vehicle when the vehicle is experiencing a driving event that is defined by the pre-defined threshold values.

3. The method of claim 1, wherein determining the current rate of change in the position of the acceleration device includes:

identifying a first position of the acceleration device, the first position of the acceleration device identified at a starting time increment;

identifying a second position of the acceleration device, the second position of the acceleration device identified at an ending time increment;

tracking an amount of time elapsed between the starting time increment and the ending time increment;

calculating a deviation value reflecting a difference between the first position and the second position; and dividing the deviation value from the amount of time elapsed between the starting time increment and the ending time increment.

4. The method of claim 3, wherein the first position of the acceleration device is defined by a first angle of the acceleration device with respect to a plane, and the second position of the acceleration device is defined by a second angle of the acceleration device with respect to the plane.

5. The method of claim 1, wherein activating the one of the ESE tunings includes executing the one of the ESE tunings through an audio system into a cabin of the vehicle.

6. The method of claim 1, wherein upon determining the current RPM value meets a corresponding one of the pre-defined threshold values, and the current rate of change in position of the acceleration device does not meet a corresponding one of the pre-defined threshold values, the method further comprises:

determining a position of the acceleration device in the vehicle, the position ranging from not engaged to fully engaged;

comparing the position of the acceleration device to the corresponding pre-defined threshold values; and activating one of the ESE tunings when the position of the acceleration device exceeds a corresponding one of the pre-defined threshold values.

7. The method of claim 1, wherein upon determining the current RPM value meets a corresponding one of the pre-defined threshold values, and the current rate of change in the acceleration device does not meet a corresponding one of the pre-defined threshold values, the method further comprises:

determining a current rate of change in RPM values of the engine;

comparing the current rate of change in the RPM values to the corresponding pre-defined threshold values; and activating one of the ESE tunings when the current rate of change in the RPM values exceeds a corresponding one of the pre-defined threshold values.

8. The method of claim 1, wherein during execution of the one of the ESE tunings, the method further comprises:

monitoring changes in the current RPM value of the engine; and continuing the execution of the one of the ESE tunings when, in response to the monitoring, the current RPM value continues to meet a corresponding one of the pre-defined threshold values.

9. The method of claim 8, wherein the current RPM value responsive to the monitoring does not meet the corresponding one of the pre-defined threshold values, the method further comprising:

monitoring a rate of change in the RPM value; and continuing the execution of the one of the ESE tunings when, in response to the monitoring, the rate of change in the RPM value meets a corresponding one of the pre-defined threshold values.

10. The method of claim 9, wherein the rate of change in the RPM value does not meet a corresponding one of the pre-defined threshold values, the method further comprising:

monitoring changes in the position of the acceleration device; and continuing the execution of the one of the ESE tunings when, in response to the monitoring, the position of the acceleration device meets a corresponding one of the pre-defined threshold values.

11. The method of claim 10, further comprising de-activating the one of the ESE tunings when, in response to the monitoring, none of the RPM value, the rate of the change in the RPM value, and the position of the acceleration device meets a corresponding one of the pre-defined threshold values.

12. A system for implementing engine sound enhancement (ESE) for a vehicle, the system comprising:

a controller implementing a computer processor; and logic executable by the controller, the logic implementing a method, the method comprising:

determining, via controller, a current rate of change in a position of an acceleration device of the vehicle from sensor data received from at least one sensor in communication with the acceleration device;

calculating an ESE value based on the current rate of change in the position of the acceleration device, the ESE value reflecting an intensity and tone quality of at least one of an exhaust and an engine of the vehicle;

receiving a current revolutions-per-minute (RPM) value of the engine;

comparing the current RPM value and the current rate of change in the position of the acceleration device to corresponding pre-defined threshold values, the pre-defined threshold values mapped to engine sound enhancement (ESE) tunings; and activating one of the ESE tunings when each of the current RPM value and the current rate of change in the position of the acceleration device meet a corresponding one of the pre-defined threshold values.

13. The system of claim 12, wherein the activated ESE tuning simulates a sound representative of at least one of the exhaust and the engine of the vehicle when the vehicle is experiencing a driving event that is defined by the pre-defined threshold values.

14. The system of claim 12, wherein determining the current rate of change in the position of the acceleration device includes:

identifying a first position of the acceleration device, the first position of the acceleration device identified at a starting time increment;

identifying a second position of the acceleration device, the second position of the acceleration device identified at an ending time increment;

tracking an amount of time elapsed between the starting time increment and the ending time increment;

calculating a deviation value reflecting a difference between the first position and the second position; and dividing the deviation value from the amount of time elapsed between the starting time increment and the ending time increment.

15. The system of claim 14, wherein the first position of the acceleration device is defined by a first angle of the acceleration device with respect to a plane, and the second position of the acceleration device is defined by a second angle of the acceleration device with respect to the plane.

16. The system of claim 12, wherein activating the one of the ESE recordings includes executing the one of the ESE recordings through an audio system into a cabin of the vehicle.

17. The system of claim 12, wherein upon determining the current RPM value meets a corresponding one of the pre-defined threshold values, and the current rate of change in position of the acceleration device does not meet a corresponding one of the pre-defined threshold values, the method further comprises:

determining a position of the acceleration device in the vehicle, the position ranging from not engaged to fully engaged;

comparing the position of the acceleration device to the corresponding pre-defined threshold values; and activating one of the ESE recordings when the position of the acceleration device exceeds a corresponding one of the pre-defined threshold values.

18. The system of claim 12, wherein upon determining the current RPM value meets a corresponding one of the pre-defined threshold values, and the current rate of change in the acceleration device does not meet a corresponding one of the pre-defined threshold values, the method further comprises:

determining a current rate of change in RPM values of the engine;

comparing the current rate of change in the RPM values to the corresponding pre-defined threshold values; and activating one of the ESE recordings when the current rate of change in the RPM values exceeds a corresponding one of the pre-defined threshold values.

19. The system of claim 12, wherein during execution of the one of the ESE recordings, the method further comprises:

monitoring changes in the current RPM value of the engine; and continuing the execution of the one of the ESE recordings when, in response to the monitoring, the current RPM value continues to meet a corresponding one of the pre-defined threshold values.

20. A computer program product implementing engine sound enhancement (ESE) for a vehicle, the computer program product comprising a computer-readable storage medium encoded with instructions, which when executed by a computer cause the computer to implement a method, the method comprising:

determining a current rate of change in a position of an acceleration device of the vehicle from sensor data received from at least one sensor in communication with the acceleration device;

calculating an ESE value based on the current rate of change in the position of the acceleration device, the ESE value reflecting an intensity and tone quality of at least one of an exhaust and an engine of the vehicle;

receiving a current revolutions-per-minute (RPM) value of the engine;

comparing the current RPM value and the current rate of change in the position of the acceleration device to corresponding pre-defined threshold values, the pre-defined threshold values mapped to engine sound enhancement (ESE) tunings; and activating one of the ESE tunings when each of the current RPM value and the current rate of change in the position of the acceleration device meet a corresponding one of the pre-defined threshold values.

* * * * *